United States Patent
Harrington et al.

(10) Patent No.: US 11,175,102 B1
(45) Date of Patent: Nov. 16, 2021

(54) LIQUID-COOLED COLD PLATE

(71) Applicant: Chilldyne, Inc., Carlsbad, CA (US)

(72) Inventors: Steven Merrill Harrington, Cardiff, CA (US); Carl Eugene Tedesco, Encinitas, CA (US)

(73) Assignee: Chilldyne, Inc., Carlsbad, CA (US)

( * ) Notice: Subject to any disclaimer, the term of this patent is extended or adjusted under 35 U.S.C. 154(b) by 0 days.

(21) Appl. No.: 17/240,717

(22) Filed: Apr. 26, 2021

Related U.S. Application Data

(60) Provisional application No. 63/175,134, filed on Apr. 15, 2021.

(51) Int. Cl.
| | |
|---|---|
| *F28F 3/12* | (2006.01) |
| *H05K 7/20* | (2006.01) |
| *F28F 13/12* | (2006.01) |
| *F28F 9/16* | (2006.01) |
| *F28F 9/00* | (2006.01) |

(52) U.S. Cl.
CPC ............. *F28F 3/12* (2013.01); *F28F 9/165* (2013.01); *F28F 13/12* (2013.01); *H05K 7/20254* (2013.01); *F28F 9/005* (2013.01); *F28F 2275/04* (2013.01)

(58) Field of Classification Search
CPC .......... H05K 7/20218; H05K 7/20254; H05K 7/20272; H05K 7/20327; H05K 7/20927; H05K 7/20936; H01L 23/473; F28F 9/0246; F28F 9/0256; F28F 9/0258; F28F 9/028; F28F 3/12; F28F 13/12; F28D 2021/0028
See application file for complete search history.

(56) References Cited

U.S. PATENT DOCUMENTS

| | | | | |
|---|---|---|---|---|
| 3,783,938 A | * | 1/1974 | Chartet | F28F 13/12 165/166 |
| 3,921,711 A | * | 11/1975 | Westbrock | F28F 13/08 165/109.1 |
| 4,090,559 A | * | 5/1978 | Megerlin | F28F 1/40 165/179 |

(Continued)

OTHER PUBLICATIONS

The Engineering Toolbox—Thermal Conductivity of Metals, Metallic Elements and Allowys.pdf (Year: 2020).*

*Primary Examiner* — Jianying C Atkisson
*Assistant Examiner* — Jose O Class-Quinones
(74) *Attorney, Agent, or Firm* — Manuel de la Cerra

(57) ABSTRACT

A liquid-cooled cold plate for removing heat from a heat-generating component is disclosed. The liquid-cooled cold plate includes a lower heat transfer plate with a flat component contact surface constructed to make thermal contact with the heat-generating component, and a plurality of parallel turbulator channels, holding a plurality of turbulators, the channels having walls that extend away from the component contact surface. The liquid-cooled cold plate also includes a lid forming a liquid tight seal with the lower heat transfer plate. The lid has an inlet end with an inlet port in fluid connection with an inlet channel manifold that allows for fluid communication between the plurality of parallel turbulator channels and the inlet port. The lid also has an outlet end with an outlet port in fluid connection with an outlet channel manifold that allows for fluid communication between the plurality of parallel turbulator channels and the outlet port.

22 Claims, 10 Drawing Sheets

(56) References Cited

U.S. PATENT DOCUMENTS

| | | | | |
|---|---|---|---|---|
| 4,395,210 | A * | 7/1983 | Hama | B29C 48/301 425/71 |
| 4,466,567 | A * | 8/1984 | Garrison | B21C 37/22 228/183 |
| 4,534,409 | A * | 8/1985 | Cadars | F28F 13/12 138/38 |
| 4,798,241 | A * | 1/1989 | Jarrett | B01F 5/0614 138/38 |
| 5,307,867 | A * | 5/1994 | Yasuda | F28F 13/12 138/38 |
| 5,978,220 | A * | 11/1999 | Frey | H01L 23/473 361/699 |
| 6,101,715 | A * | 8/2000 | Fuesser | H01C 1/082 29/890.03 |
| 6,351,384 | B1 * | 2/2002 | Daikoku | F28F 3/02 165/80.3 |
| 6,367,543 | B1 * | 4/2002 | Calaman | F28F 3/022 165/134.1 |
| 6,615,911 | B1 * | 9/2003 | Bhatti | F28F 7/02 138/38 |
| 6,655,449 | B1 * | 12/2003 | Hsien | H01L 23/473 165/170 |
| 6,992,382 | B2 * | 1/2006 | Chrysler | H01L 23/473 257/706 |
| 7,007,506 | B2 * | 3/2006 | Kubo | F28D 15/0266 165/170 |
| 7,900,692 | B2 * | 3/2011 | Miyahara | H01L 23/473 165/104.26 |
| 8,331,092 | B2 * | 12/2012 | Kawaura | H01L 23/473 361/699 |
| 8,598,702 | B2 * | 12/2013 | Kwak | H05K 7/20927 257/714 |
| 9,010,141 | B2 * | 4/2015 | Harrington | F28F 7/02 62/259.2 |
| 9,657,997 | B2 * | 5/2017 | Fujita | H01L 23/473 |
| 2004/0182544 | A1 * | 9/2004 | Lee | H01L 23/473 165/80.4 |
| 2005/0011635 | A1 * | 1/2005 | Liu | F28F 13/12 165/109.1 |
| 2005/0178531 | A1 * | 8/2005 | Huang | H01L 23/473 165/104.31 |
| 2005/0199373 | A1 * | 9/2005 | Godet | H01L 23/473 165/80.4 |
| 2005/0241806 | A1 * | 11/2005 | Liu | F28F 9/26 165/104.21 |
| 2007/0029665 | A1 * | 2/2007 | Lee | H01L 23/473 257/712 |
| 2007/0241468 | A1 * | 10/2007 | Kammerzell | F28C 1/02 261/153 |
| 2008/0024990 | A1 * | 1/2008 | Peng | H01L 23/473 361/700 |
| 2008/0105413 | A1 * | 5/2008 | Peng | F28F 3/048 165/104.33 |
| 2008/0229580 | A1 * | 9/2008 | Anderson | F28F 3/12 29/890.03 |
| 2009/0065178 | A1 * | 3/2009 | Kasezawa | H01L 23/473 165/104.19 |
| 2009/0200007 | A1 * | 8/2009 | Foy | H01L 23/473 165/287 |
| 2009/0250195 | A1 * | 10/2009 | Yoshida | F28F 3/12 165/80.3 |
| 2010/0059215 | A1 * | 3/2010 | Kolb | F28F 9/0234 165/152 |
| 2010/0090336 | A1 * | 4/2010 | Yoshida | H01L 23/473 257/717 |
| 2010/0296249 | A1 * | 11/2010 | Li | G06F 1/20 361/700 |
| 2011/0079376 | A1 * | 4/2011 | Loong | H01L 23/473 165/185 |
| 2012/0014066 | A1 * | 1/2012 | Morino | H01L 23/473 361/707 |
| 2012/0145362 | A1 * | 6/2012 | Harrington | H01L 23/473 165/109.1 |
| 2012/0152500 | A1 * | 6/2012 | Kao | H01L 23/473 165/109.1 |
| 2012/0160465 | A1 * | 6/2012 | Webb | F28F 13/06 165/173 |
| 2012/0186791 | A1 * | 7/2012 | Ciora, Jr. | F28F 13/12 165/109.1 |
| 2013/0025837 | A1 * | 1/2013 | Takenaga | H01L 23/473 165/168 |
| 2013/0228914 | A1 * | 9/2013 | Di Stefano | F28F 13/06 257/712 |
| 2013/0343001 | A1 * | 12/2013 | Kwak | H01L 23/473 361/717 |
| 2014/0069614 | A1 * | 3/2014 | Chiu | F28D 15/00 165/104.13 |
| 2014/0311176 | A1 * | 10/2014 | Meng | F28F 3/022 62/314 |
| 2015/0351283 | A1 * | 12/2015 | Yamada | H01L 23/473 165/80.4 |
| 2018/0343771 | A1 * | 11/2018 | Wei | F28F 9/26 |
| 2019/0107341 | A1 * | 4/2019 | Yoshida | F16L 9/18 |
| 2019/0327856 | A1 * | 10/2019 | Lan | H05K 7/20272 |
| 2019/0366876 | A1 * | 12/2019 | Cheadle | B60L 50/64 |
| 2020/0049432 | A1 * | 2/2020 | Manay | F28D 21/0005 |
| 2020/0106145 | A1 * | 4/2020 | Schmitt | H01M 10/6568 |
| 2020/0106146 | A1 * | 4/2020 | Schmitt | F28F 3/12 |
| 2020/0110448 | A1 * | 4/2020 | Lee | G06F 1/20 |
| 2020/0352053 | A1 * | 11/2020 | Mizerak | H01L 23/4006 |

* cited by examiner (Line 7-7)

(Line 8-8)

(Line 9-9)

LIQUID-COOLED COLD PLATE

RELATED APPLICATIONS

This application claims priority to provisional patent application 63/175,134 filed on Apr. 15, 2021 and titled Liquid-Cooled Cold Plate, the entire contents of which are incorporated by reference.

The present application is related to U.S. Pat. No. 8,820,351 issued on Sep. 2, 2014; U.S. Pat. No. 9,010,141 issued on Apr. 21, 2015; U.S. Pat. No. 9,161,480 issued on Oct. 13, 2015; U.S. patent Ser. No. 10/920,772 issued on Feb. 16, 2021; U.S. patent Ser. No. 10/582,641 issued on Mar. 3, 2020; application Ser. No. 12/762,898 filed on Apr. 19, 2010; application Ser. No. 61/451,214 filed on Mar. 10, 2011; application Ser. No. 13/308,208 filed on Nov. 30, 2011; App. Ser. 61/595,989 filed on Feb. 7, 2012; App. Ser. 61/839,246 filed on Jun. 25, 2013; Application Ser. No. 14/289,478 filed on May 28, 2014; application Ser. No. 14/685,524 filed on Apr. 13, 2015; App. Ser. 62/569,786 filed on Oct. 9, 2017; application Ser. No. 15/782,034 filed on Oct. 12, 2017; and application Ser. No. 16/589,011 filed Sep. 30, 2019. The full disclosure of each of these references is herein incorporated by reference.

TECHNICAL FIELD

The present invention relates to systems and methods for cooling computer systems.

BACKGROUND

Arrays of electronic computers or components, such as those found in data centers, generate a great deal of heat. An example central processing unit of a server computer ("CPU") generates over 280 watts of heat (some can generate much more than this) and has a maximum case temperature of about 68 C. An example array (or rack) of 154 CPUs may generate 77 kW of heat.

The standard way to keep data centers cool is to use expensive and relatively inefficient vapor-compression refrigeration systems at least part of the time. These conventional cooling or "air conditioning" systems often use more power than the computers themselves, and all of that power is discharged to the environment as waste heat. These systems use air as the heat transfer medium, and it is due to the low heat capacity and low thermal conductivity of air that refrigeration must be used to remove the heat generated by multiple air heat exchangers. Some operators use the evaporation of a cooling liquid to cool liquid-to-air heat exchangers. While this is more thermally efficient than refrigeration, the computers run hotter, reducing their reliability, decreasing their efficiency and making the data center uncomfortable for human occupants.

Water is used as the coolant throughout this disclosure, but it will be known to those in art that other coolants may be used. Water has approximately 4000 times more heat capacity than air of the same volume, so water is a theoretically ideal heat transfer agent for direct heat transfer from heat generating components. Other coolants offer similar performance. For example, the coolant may consist essentially of water, including tap water, or may comprise one or more perfluorocarbons or avionics cooling liquids. Liquid cooling is recognized as a thermally efficient way to cool computer CPUs due to their high concentration of power and heat generation in a small space, but the rest of a computer's electronics generate heat at a lower rate and temperature, so air-cooling may be appropriate for much of the associated hardware.

Current systems may use liquid cooling to move the heat from the CPU to a radiator mounted close to the CPU, or they may use an air-to-liquid heat exchanger to remove heat from the computer enclosure. These systems suffer from the high thermal resistance and bulkiness of air-to-liquid or liquid-to-air heat exchangers. Other systems use a chilled coolant loop to cool the computer, but these systems require complex and expensive connectors and plumbing to connect the server to the building coolant supply while insuring that no leaks occur, which may be devastating in or near a computer. Accordingly, operators of server systems are rightly concerned about leaks and reliability of using liquid to cool computers. Furthermore, chillers require a large amount of power. Additionally, for operation in a data center, servers, particularly blade servers, need to be compact.

Finally, devices are necessary to transfer the heat from the heat-producing component/device into the liquid coolant system. While cold plates are known in the art, the typical design uses thin-skived micro fins (for example, 75 microns thick on 300-micron pitch and 3 mm tall). These fins are easily clogged, corroded, and may fall off, reducing their effectiveness during operation. Moreover, adjusting the cold plate flow and pressure drop is difficult, and they take a long time to manufacture, as each fin is cut one at a time.

Therefore, what is needed is a compact cooling solution adaptable to cooling a large number of computers. Further, what is needed is a low-cost liquid-cooled cold plate that can be in thermal contact with the heat-producing components/devices.

SUMMARY

The present invention provides an elegant solution to the needs described above and offers numerous additional benefits and advantages, as will be apparent to persons of skill in the art. A liquid-cooled cold plate for removing heat from a heat-generating component is disclosed. The liquid-cooled cold plate includes a lower heat transfer plate with a flat component contact surface constructed to make thermal contact with the heat-generating component, and a plurality of parallel turbulator channels, holding a plurality of turbulators, the channels having walls that extend away from the component contact surface. The liquid-cooled cold plate also includes a lid forming a liquid tight seal with the lower heat transfer plate. The lid has an inlet end with an inlet port in fluid connection with an inlet channel manifold that allows for fluid communication between the plurality of parallel turbulator channels and the inlet port. The lid also has an outlet end with an outlet port in fluid connection with an outlet channel manifold that allows for fluid communication between the plurality of parallel turbulator channels and the outlet port.

A liquid-cooled cold plate defines a coolant path entering through the inlet port, through the inlet channel manifold, though the plurality of parallel turbulator channels, and while in the turbulator channels contacting the turbulators, through the outlet channel manifold, and exiting through the outlet port.

The liquid-cooled cold plate may have an anti-bulge reinforcement member across a portion of the lid. The outlet and inlet ports may have fittings, that may be threaded onto the liquid-cooled cold plate. The fittings may include gaskets.

The lid may have one or more mounting holes.

A gasket may be used between the lower heat transfer plate and the lid to provide a liquid tight seal. Adhesive may be used between the lower heat transfer plate and the lid to provide a liquid tight seal. The lid and the lower heat transfer plate may be brazed together to provide a liquid-tight seal. Formed into either or both of the lower heat transfer plate and lid may be a gasket channel, and a gasket or O-ring may be disposed of in the gasket channel to assist in forming a liquid tight seal between the lower heat transfer plate and the lid.

The plurality of turbulators may be made of a compressible material and the lid may compress the turbulators to form a seal within the plurality of turbulator channels.

Methods of manufacturing the liquid-cooled cold plate are also disclosed. For example, the lower heat transfer plate may be formed by milling, casting or extrusion. The lid may be formed by injection molding or 3-D printing.

The shape of the turbulator channels may be a trapezoid with a narrow portion closest to the heat source and a wider portion furthest from the heat source, the shape being optimized so that the portion of the fin furthest from the heat source is nearly the same temperature as the portion closest to the heat source, thereby maximizing the fin efficiency.

Additional aspects, alternatives and variations as would be apparent to persons of skill in the art are also disclosed herein and are specifically contemplated as included as part of the invention. The invention is set forth only in the claims as allowed by the patent office in this or related applications, and the following summary descriptions of certain examples are not in any way to limit, define or otherwise establish the scope of legal protection.

BRIEF DESCRIPTION OF THE DRAWINGS

The invention can be better understood with reference to the following figures. The components within the figures are not necessarily to scale, emphasis instead being placed on clearly illustrating example aspects of the invention. In the figures, like reference numerals designate corresponding parts throughout the different views and/or embodiments. Furthermore, various features of different disclosed embodiments can be combined to form additional embodiments, which are part of this disclosure. It will be understood that certain components and details may not appear in the figures to assist in more clearly describing the invention.

DETAILED DESCRIPTION

Figure 1:
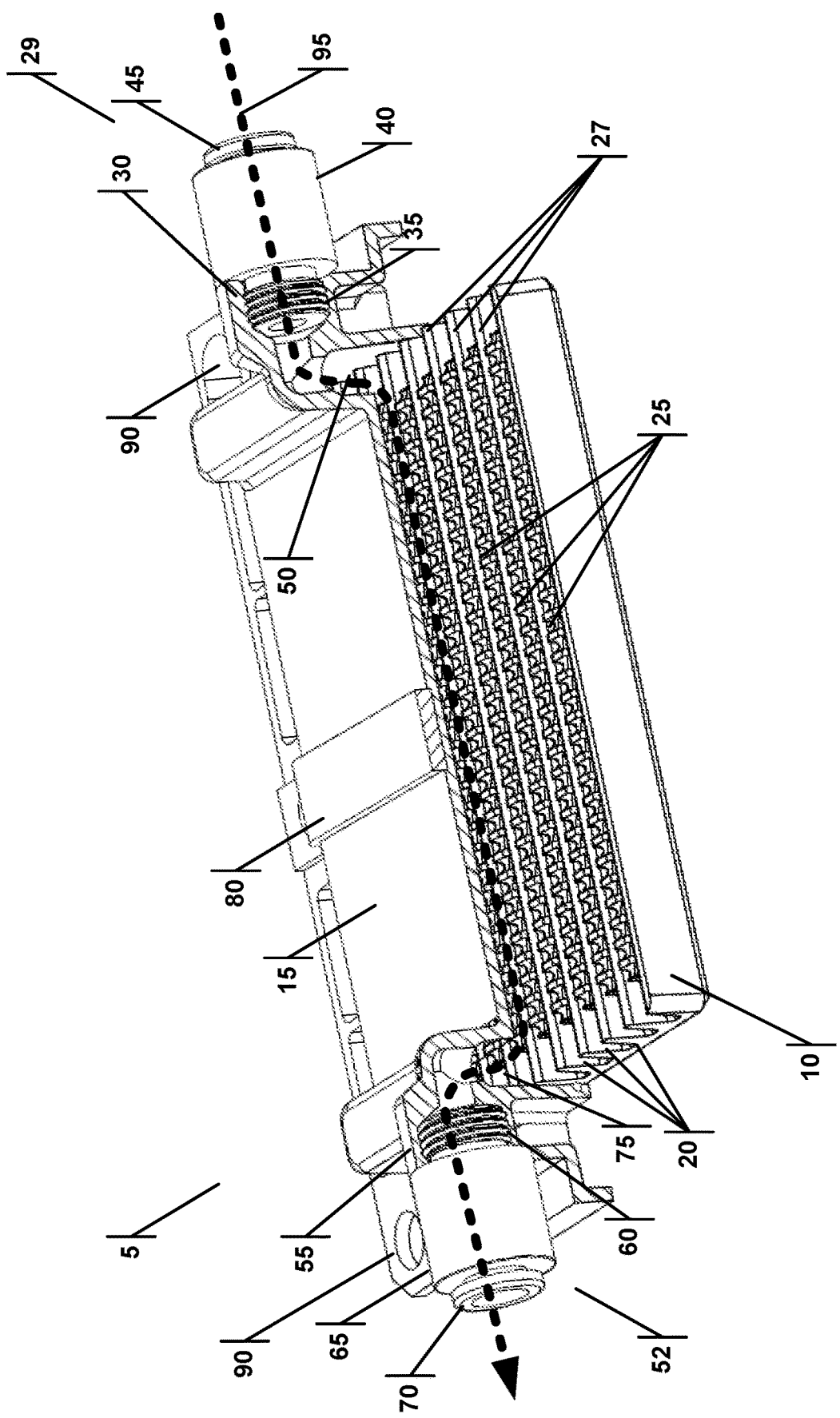
FIG. 1 illustrates a liquid-cooled cold plate where the lid is in cross-sectional view.
Figure 2:
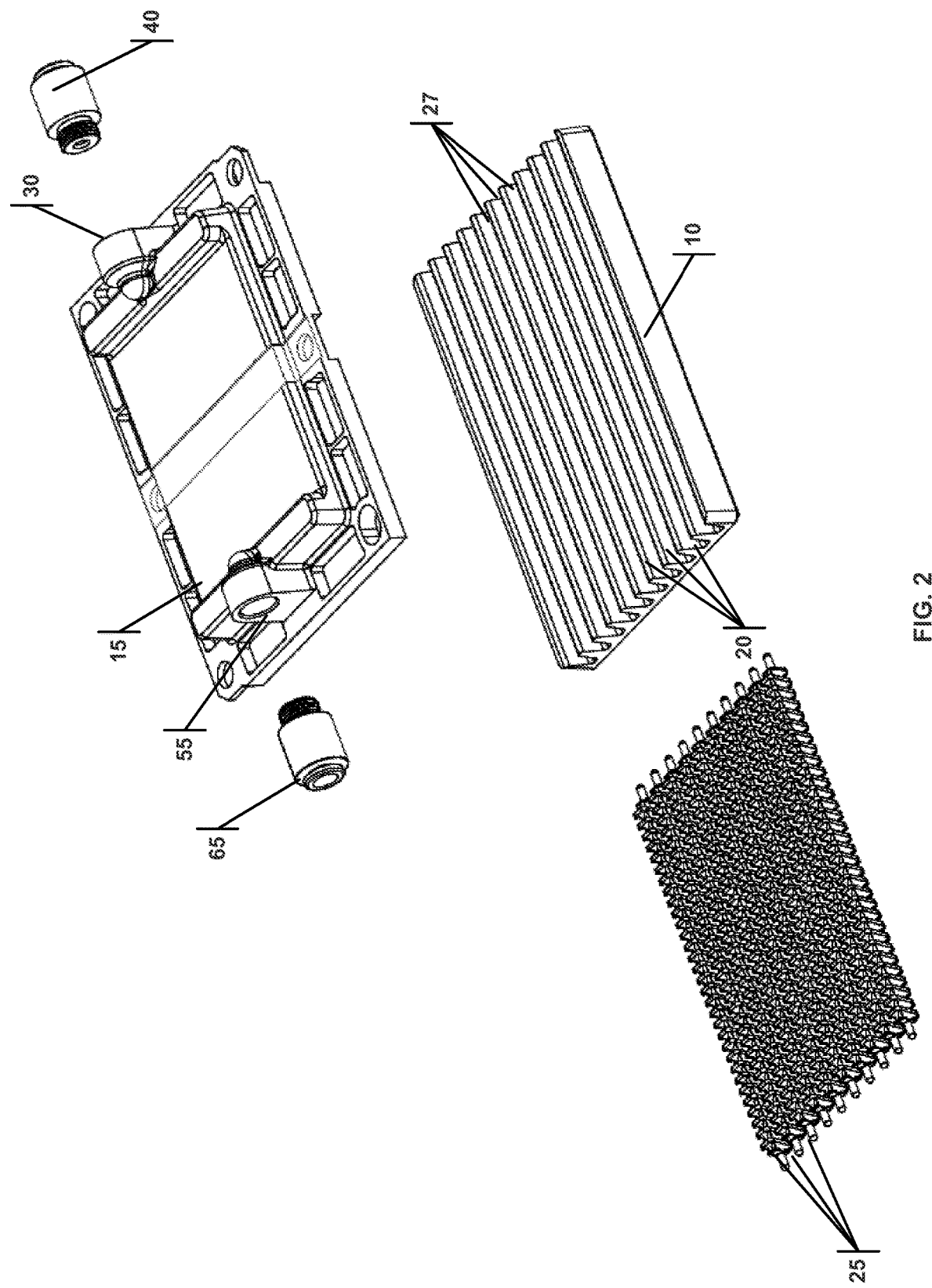
FIG. 2 illustrates the liquid-cooled cold plate in exploded view.
Figure 3:
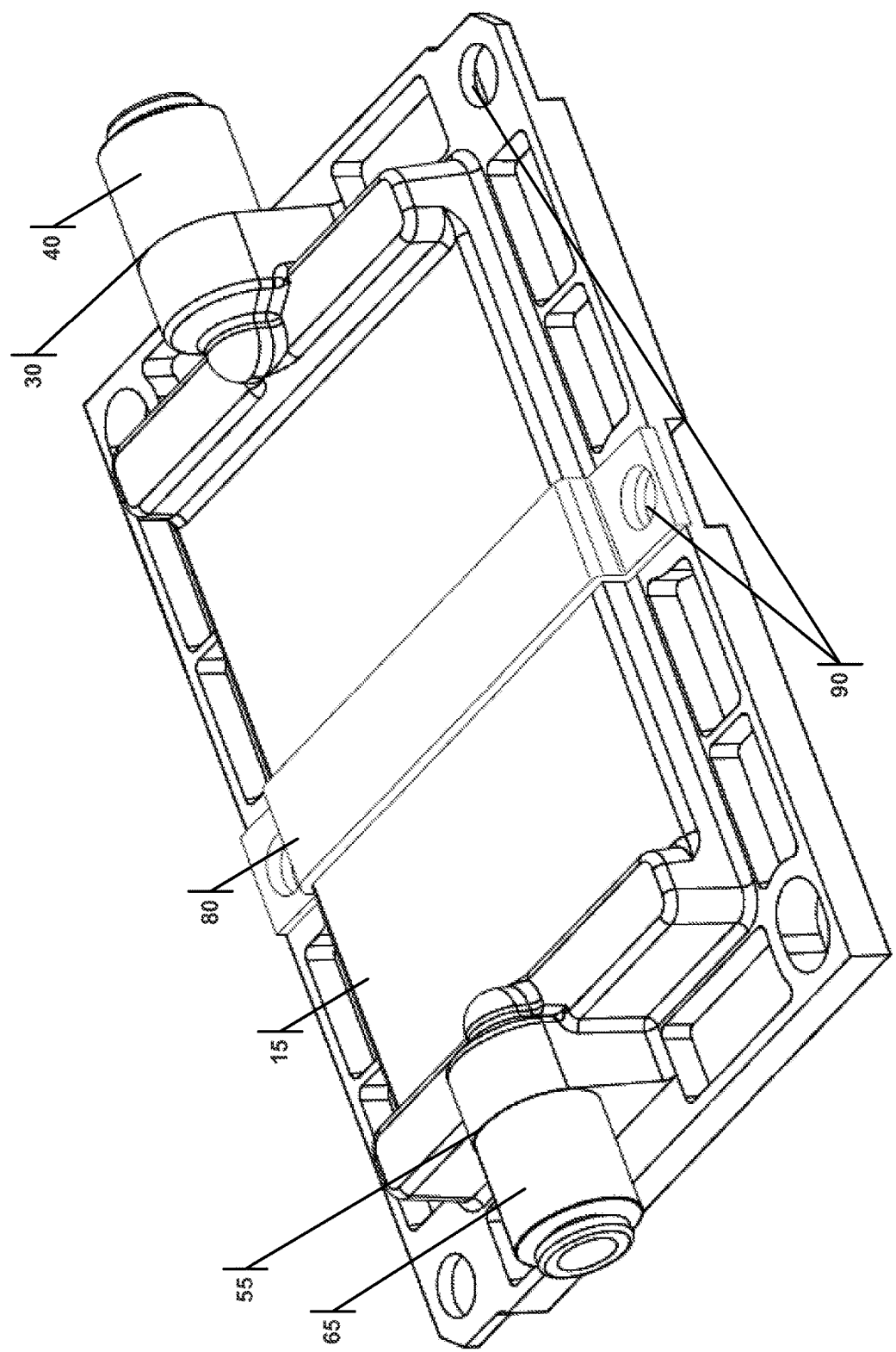
FIG. 3 illustrates the lid of the liquid-cooled cold plate, with an anti-bulge reinforcement member/strap.
Figure 4:
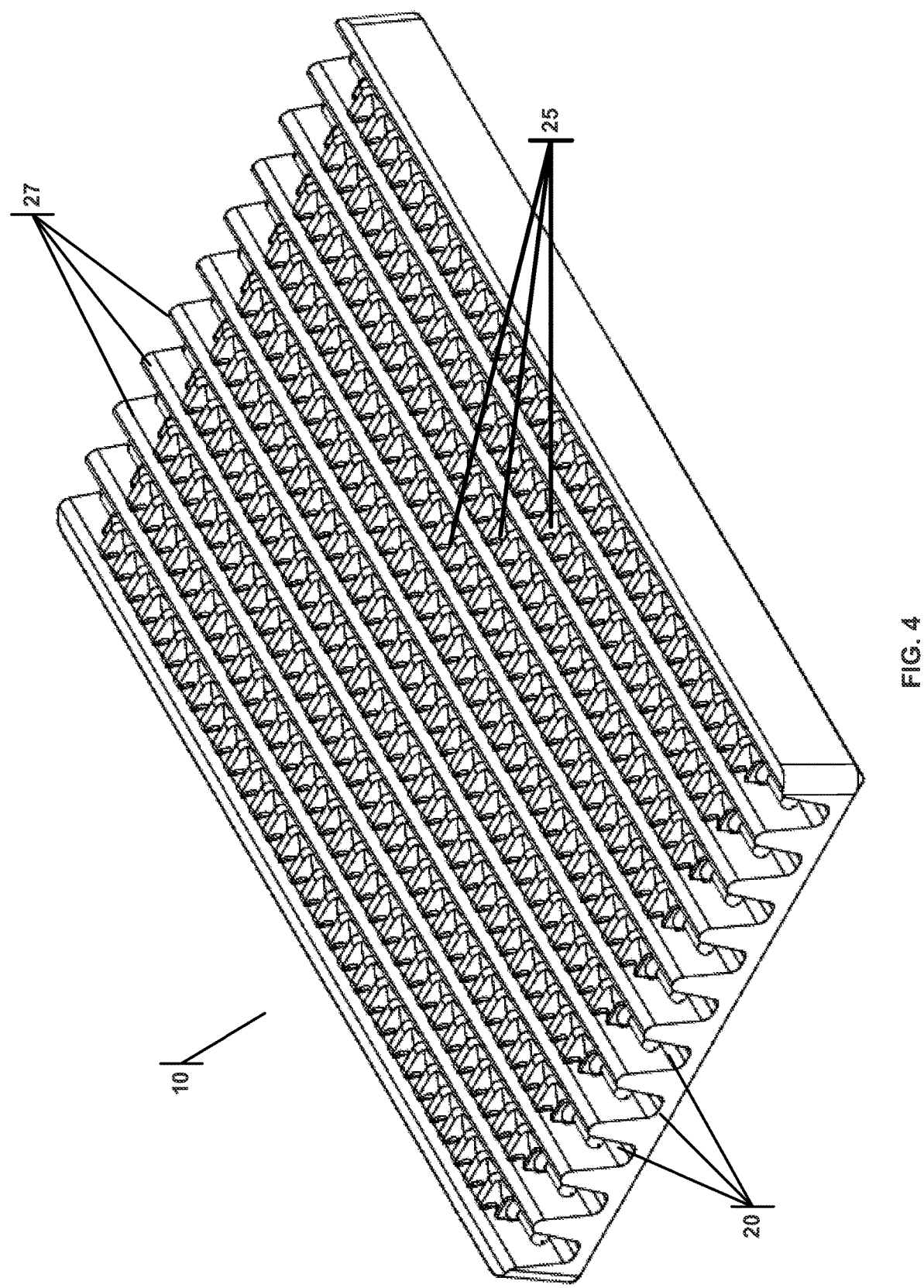
FIG. 4 illustrates the lower heat transfer plate of the liquid-cooled cold plate, with turbulators disposed within the turbulator channels.
Figure 5:
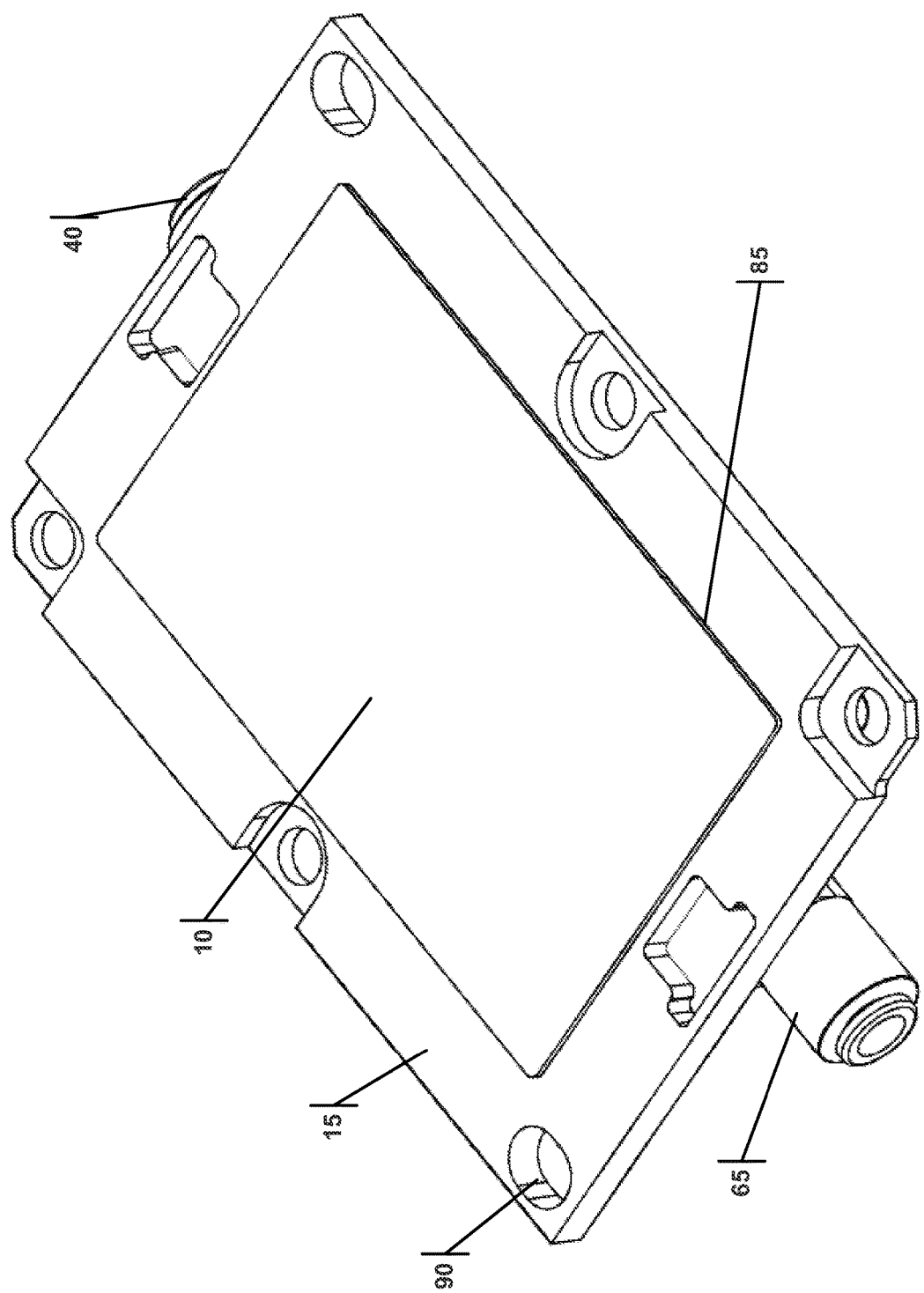
FIG. 5 illustrates a bottom perspective view of the assembled liquid-cooled cold plate.
Figure 6:
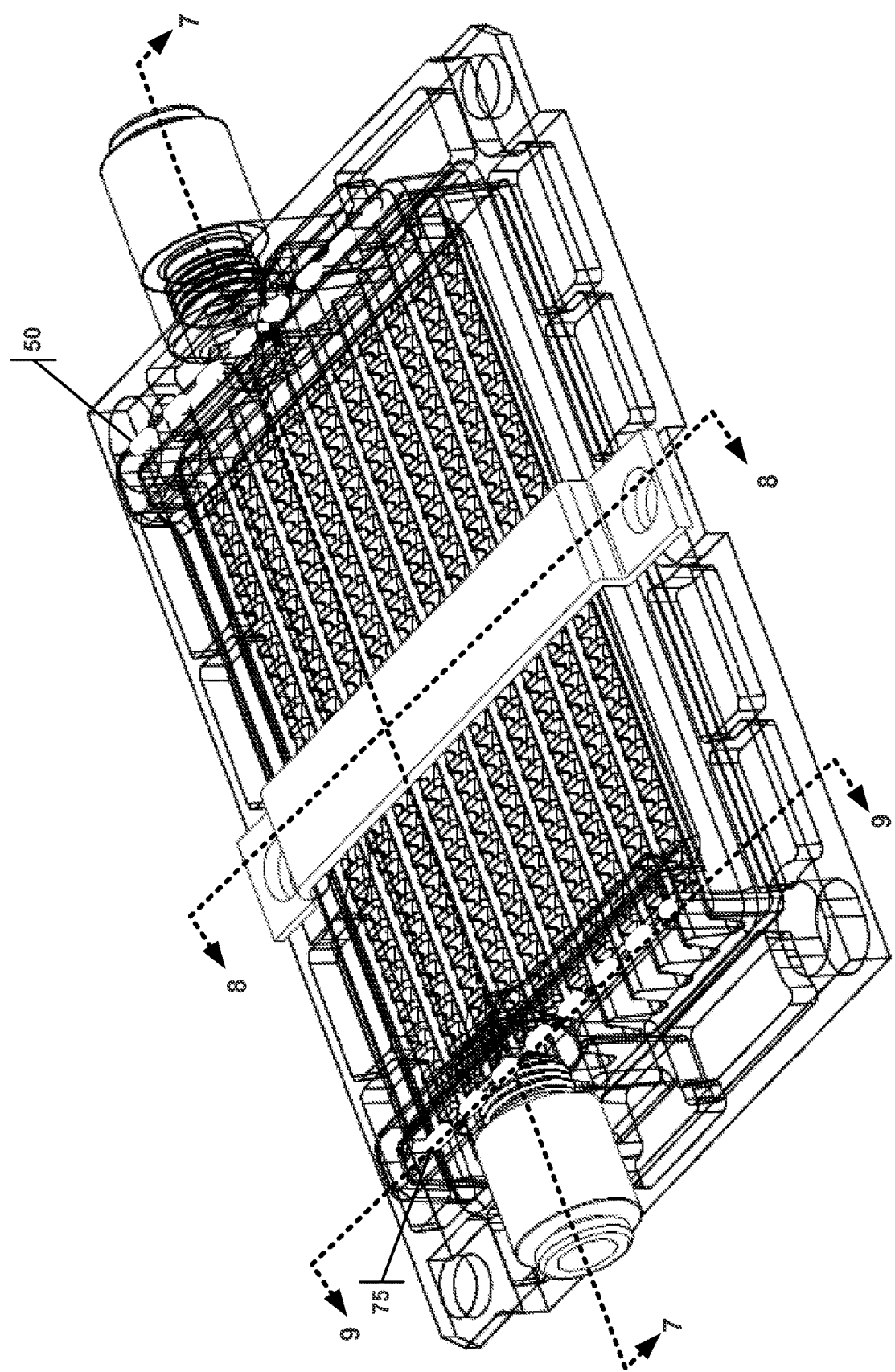
FIG. 6 illustrates a top transparent perspective view of the assembled liquid-cooled cold plate, with cross-sectional lines 7-7, 8-8 and 9-9, further shown in FIGS. 7, 8 and 9, respectively.

Reference is made herein to some specific examples of the present invention, including any best modes contemplated by the inventor for carrying out the invention. Examples of these specific embodiments are illustrated in the accompanying figures. While the invention is described in conjunction with these specific embodiments, it will be understood that it is not intended to limit the invention to the described or illustrated embodiments. To the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, process operations well known to persons of skill in the art have not been described in detail in order not to obscure unnecessarily the present invention. Various techniques and mechanisms of the present invention will sometimes be described in singular form for clarity. However, it should be noted that some embodiments include multiple iterations of a technique or multiple mechanisms unless noted otherwise. Similarly, various steps of the methods shown and described herein are not necessarily performed in the order indicated, or performed at all in certain embodiments. Accordingly, some implementations of the methods discussed herein may include more or fewer steps than those shown or described. Further, the techniques and mechanisms of the present invention will sometimes describe a connection, relationship or communication between two or more entities. It should be noted that a connection or relationship between entities does not necessarily mean a direct, unimpeded connection, as a variety of other entities or processes may reside or occur between any two entities. Consequently, an indicated connection does not necessarily mean a direct, unimpeded connection, unless otherwise noted.

The following list of example features corresponds with the attached figures and is provided for ease of reference, where like reference numerals designate corresponding features throughout the specification and figures:

Liquid-Cooled Cold Plate 5
Lower Heat Transfer Plate 10
Flat Contact Surface 12
Lid 15
Turbulator Channel 20
Turbulator 25
Center Core 26
Turbulator Walls 26-1
Coolant Path About the Turbulator 26-2
Turbulator Channel Walls 27
Inlet End 29
Inlet Port 30
Inlet Port Threading 35
Inlet Port Fitting 40
Inlet Port Fitting Gasket 45
Inlet Channel Manifold 50
Outlet End 52
Outlet Port 55
Outlet Port Threading 60
Outlet Port Fitting 65
Outlet Port Fitting Gasket 70

Outlet Channel Manifold 75
Anti-Bulge Reinforcement Member/Strap 80
Adhesive Slot/Channel 85
Mounting Holes 90
Coolant Path 95
Coolant Flow Through Manifold 100
Gasket/O-ring 105
Gasket Channel 110

Disclosed in FIGS. 1-10 is an easy-to-manufacture, low-cost, high-performance liquid-cooled cold plate 5 that removes heat from central processing units or graphic processing units or other high-power semiconductors. The liquid-cooled cold plate 5 includes a lower heat transfer plate 10 with a flat component contact surface 12 constructed to make thermal contact with the heat-generating component. The heat transfer plate 10 has a plurality of parallel turbulator channels 20, holding a plurality of turbulators 25, the channels having walls 27 that extend away from the component contact surface 12. A cross-section taken perpendicularly across the turbulator channel walls 27 shows that the turbulator channel 20 cross-section is non-circular, as is the turbulator 25 cross-section. See FIG. 8. The liquid-cooled cold plate 5 also includes a lid 15, forming a liquid tight seal with the lower heat transfer plate 10. The lid 15 has an inlet end 29, with an inlet port 30 in fluid connection with an inlet channel manifold 50 that allows for fluid communication between the plurality of parallel turbulator channels 20 and the inlet port 30. The lid 15 also has an outlet end 52, with an outlet port 55 in fluid connection with an outlet channel manifold 75 that allows for fluid communication between the plurality of parallel turbulator channels 20 and the outlet port 55.

The cold plate 5 consists of a lower heat transfer plate 10 with of a set of fins or walls 27 which define turbulator channels 20 and into which rectangular, trapezoidal or circular turbulators 25 are placed. The turbulators 25 are similar to those described in patent application US20120145362A1 (Ser. No. 13/308,208), incorporated herein by reference. The turbulators 25 force the coolant liquid into a helical path so that the heat transfer from the turbulator channels 20 to the coolant is increased. A lid 15 covers the turbulators 25, and holds the turbulators 25 in place. The lid 15 and the lower heat transfer plate 10 are sealed together so that the coolant does not leak out or that air does not leak in, and so that minimal coolant leaks past the radial fins on the turbulator 25 (which would reduce the heat transfer efficiency).

Figure 9:
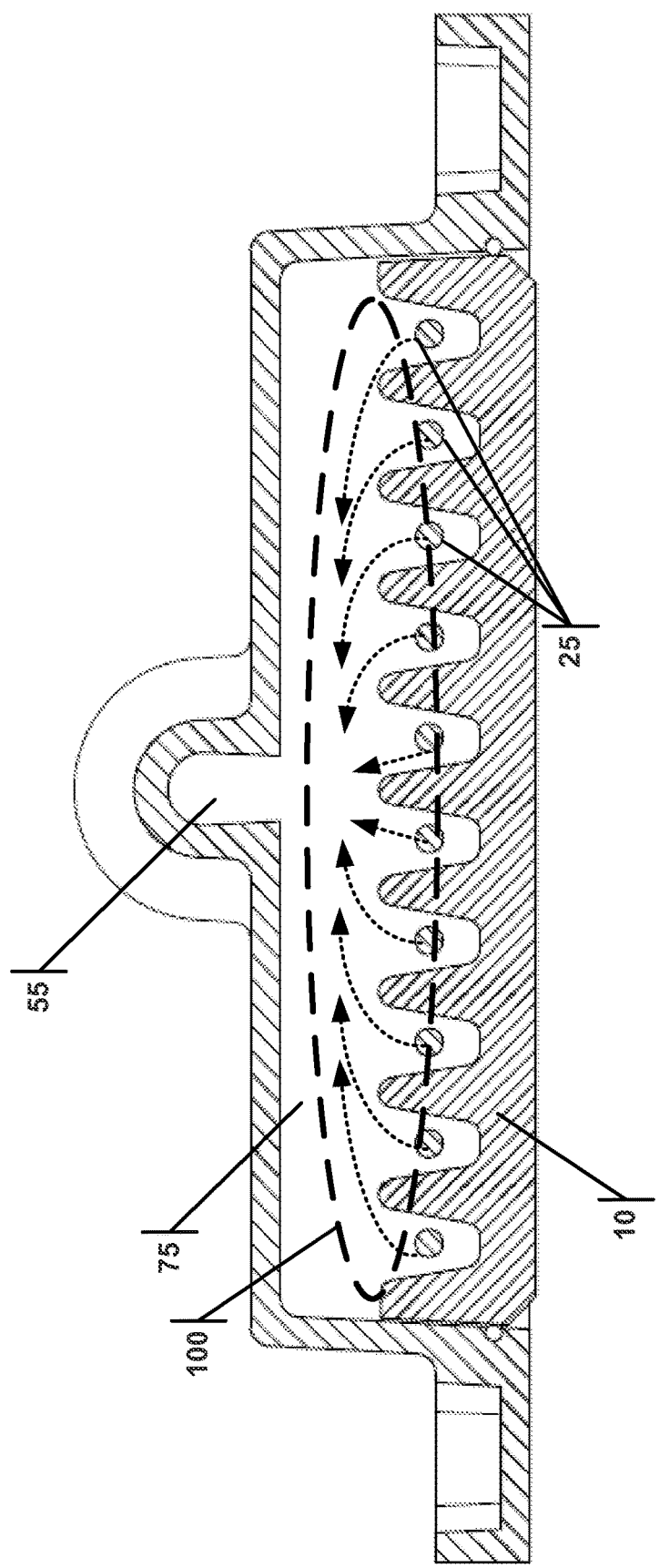
FIG. 9 illustrates a cross-sectional view of the liquid-cooled cold plate taken along line 9-9 of FIG. 6, highlighting the coolant flow through the outlet channel manifold.

The lid may have an inlet end 29 and an outlet end 52. The fluid follows a helical path, as defined by the turbulator. The inlet side end 29 and outlet end 52 have similar features. For example, the inlet end 29 comprises an inlet port 30, with threading 35 to receive an inlet port fitting 40 with a gasket 45 that allows for a true seal with tubing that connects to the liquid coolant system (not shown). The inlet port 30 is in fluid connection with an inlet channel manifold 50, that distribute the coolant flow from the inlet port 30 to the plurality of turbulator channels 20. On the outlet end 52, the outlet channel manifold 75 collects the coolant flow from the plurality of turbulator channels 20, and transmits the coolant to the outlet port 55. The coolant flow collection is illustrated in FIG. 9. The outlet port 55 may contain threading 60 to receive an outlet port fitting 65 with an gasket 70 that allows for a true seal with tubing that connects to the liquid coolant system (not shown). Other fittings, such as hose barbs, may be used.

Figure 7:
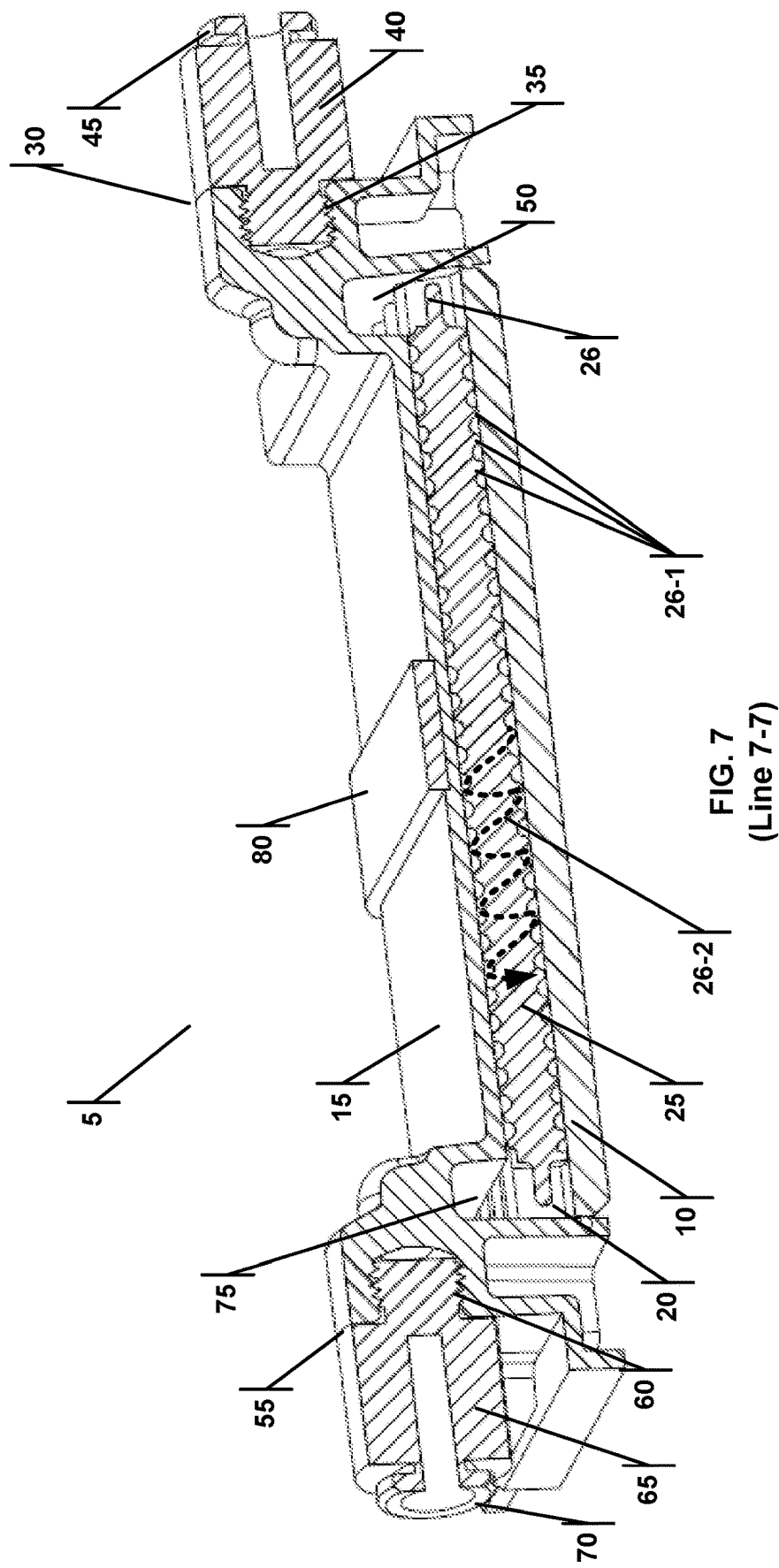
FIG. 7 illustrates a cross-sectional view of the liquid-cooled cold plate taken along line 7-7 of FIG. 6.
Figure 8:
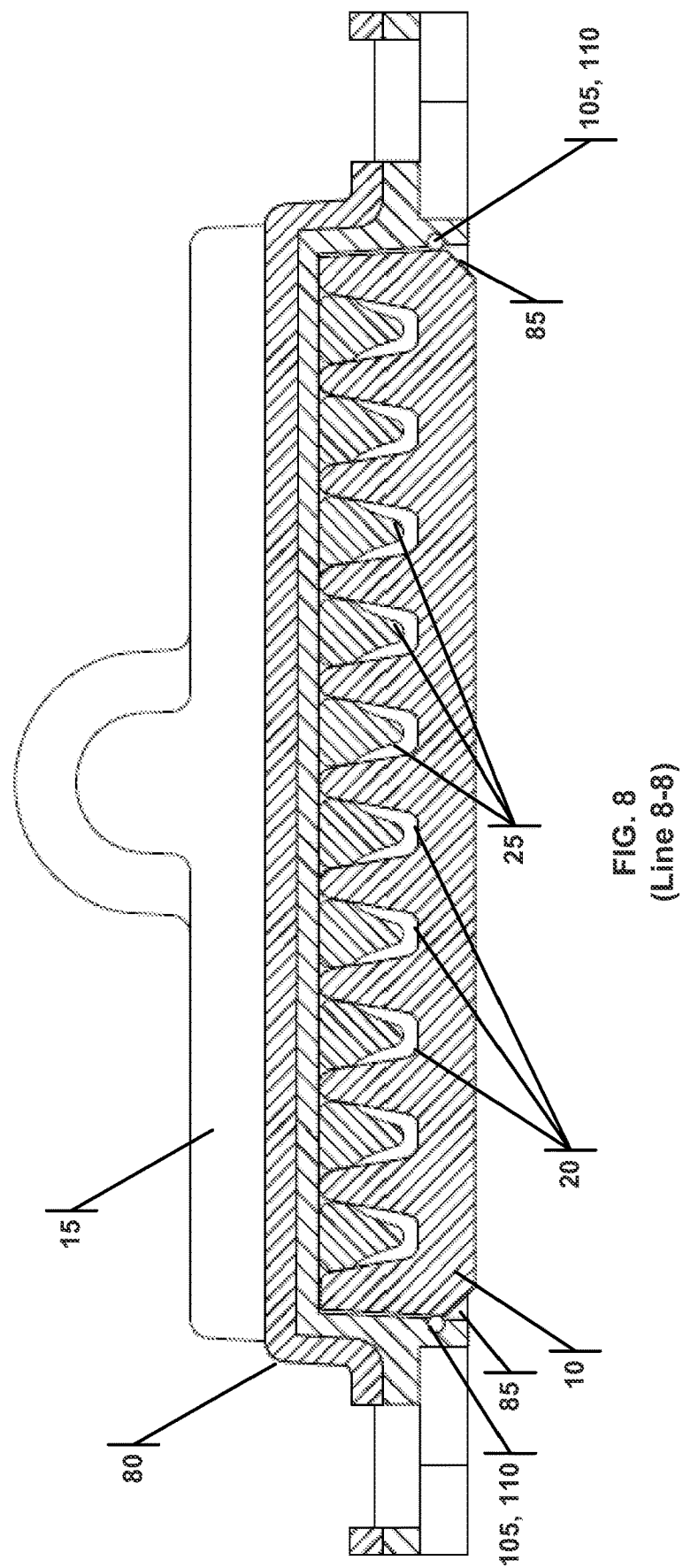
FIG. 8 illustrates a cross-sectional view of the liquid-cooled cold plate taken along line 8-8 of FIG. 6.

The lid may incorporate an inlet channel manifold 50 and an outlet channel manifold 75 to allow the coolant to enter and leave the liquid-cooled cold plate 5. The manifolds conduct coolant fluid to some or all of the turbulators 25, and collect coolant from those turbulators 25. The liquid-cooled cold plate 5 defines a coolant path 95 entering through the inlet port 30, through the inlet channel manifold 50, though the plurality of parallel turbulator channels 20, and while in the turbulator channels 20 contacting the turbulators 25, through the outlet channel manifold 75, and exiting through the outlet port 55. This is shown as arrow 95 (FIG. 1). Further as shown in FIG. 7, the turbulator 25 may have a center core 26 with turbulator walls 26-1 extending away from the center core 26 and defining a coolant path (shown by arrow 26-2) that wraps about the center core 26 allowing the fluid to contact the lid 15 and lower heat transfer plate 10.

The turbulators 25 can be connected in series or in parallel or in any combination thereof. The turbulators 25 can be non-thermally conductive or thermally conductive, and, if made of metal, they can be brazed or soldered in place in the turbulator channel 20 for better heat transfer, or they can just be dropped into spaces formed by the fins. They can be forged or cast out of copper or aluminum or injection molded out of plastic or any suitable material. The turbulators 25 can be made of a temperature-resistant rubber. The turbulators 25 could also be made of other compressible materials like, for example, silicone rubber that would allow the lid 15 to compress the turbulator for a tight seal to the passages formed by the turbulator channels 20 and the lid 15, regardless of manufacturing tolerances.

The turbulators 25 may be connected together to make the device easier to assemble. Although not shown, the turbulator channels 20 may be formed into the lid 15, instead of, or in addition to, the turbulator channels 20 in the lower heat transfer plate 10. The turbulators 25 may also be interrupted to create a space for structural ribs across the heat transfer surface of the lower heat transfer plate 10.

Figure 10:
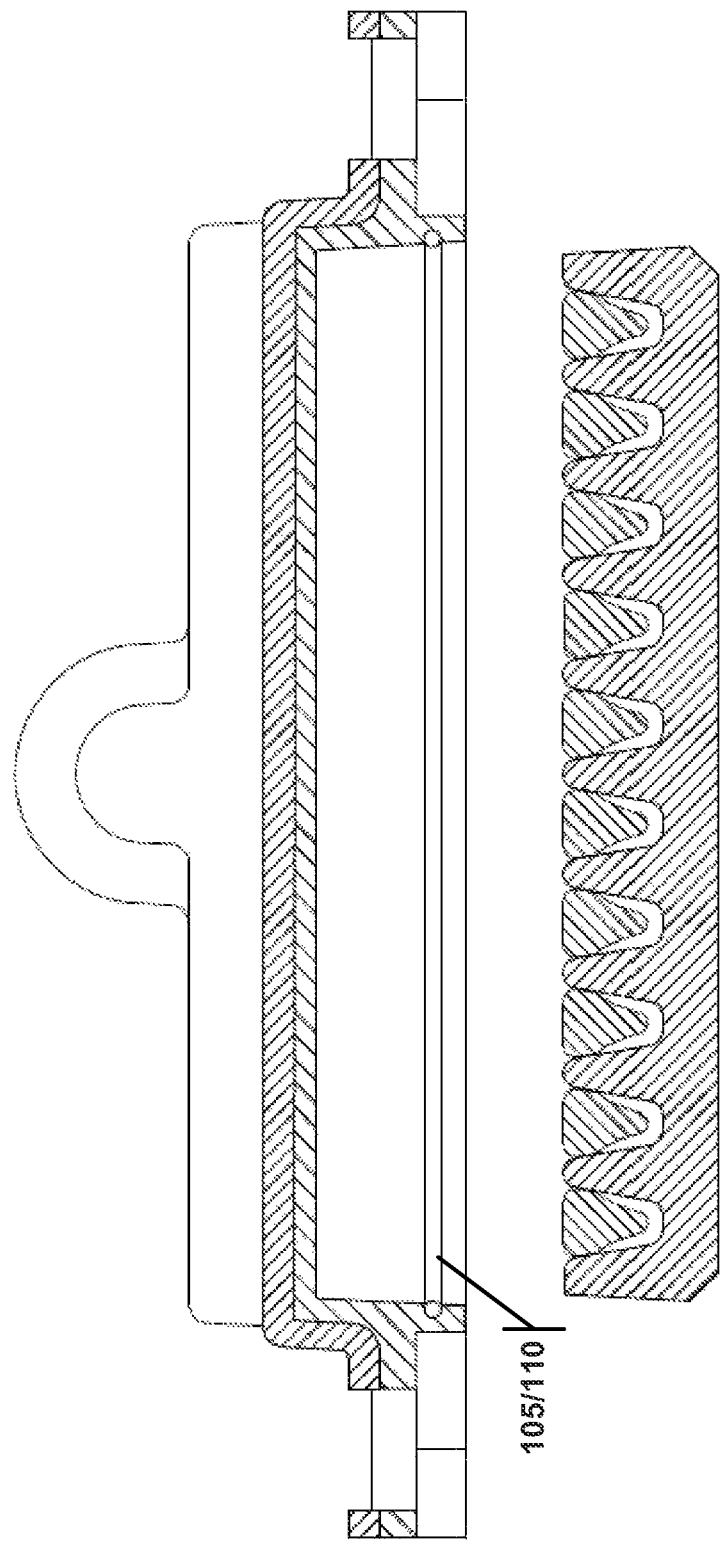
FIG. 10 illustrates a cross-section to highlight the O-ring and gasket channel.

The top or sides of the lid can include hose barbs or fitting 40, 65 to connect to inlet and outlet tubing. The thermal performance and pressure drop of the liquid-cooled cold plate 5 can be modified by changing the pitch, root diameter or number or starts of the turbulators 25. Formed in either or both of the lower heat transfer plate 10 and lid 15 may be a gasket channel 110, and a gasket or O-ring 105 may be disposed of in the gasket channel 110 to assist in forming a liquid tight seal between the lower heat transfer plate 10 and the lid 15. This is shown in FIG. 10. Alternatively or in addition to, the lid 15 can be brazed, soldered or glued on to the lower heat transfer plate 10. An automatic gluing machine can fill the glue slot 85 gap in between the edge of the lower heat transfer plate 10 and the lid 15.

The design may include transverse grooves in between turbulator channels 20 in the thermally conductive lower heat transfer plate 10 attached to the heat generating device so that the thickness of the material between the heat transfer surface and the coolant surface is as thin as possible while considering requirements structural rigidity in order to maintain a flat heat transfer surface. A thinner lower heat transfer plate 10 allows for better thermal conductivity and less metal material. However, the lower heat transfer plate 10 must be stiff enough so that the plate does not bend more than 0.001 inch when secured to the heat generating device. Such bending or bulging negatively affects the efficiency of the liquid-cooled cold plate 5. To restrict bulging, an anti-bulge reinforcement member/strap 80 may be used across the liquid-cooled cold plate 5 to provide structural rigidity. The strap 80 may fit into grooves in the lid 15 to provide additional structural rigidity.

The proposed design with multiple parallel turbulators provides more corrosion resistance than the standard thin-skived fin design, as corrosion in the metal only increases the diameter of the flow passage and does not pose a risk that a thin fin would be corroded from both sides and potentially fall off.

The lid 15 could be snapped into slots or screwed or otherwise attached to the lower heat transfer plate 10 for ease of assembly. Hold-down screws for the liquid-cooled cold plate 5 may be inserted through mounting holes 90 to attach the liquid-cooled cold plate 5 to the heat-producing component/device. The lid 15 can be formed into a convex shape where it contacts the lower heat transfer plate 10, flattening under load to prevent the liquid-cooled cold plate 5 from bending when attached to the heat-producing component/device, and thereby ensuring good contact between the liquid-cooled cold plate 5 and the heat-producing component/device. The liquid-cooled cold plate 5 can be covered by an external anti-bulge reinforcement member/strap 80, which may be steel or another strong and rigid material. This external strap 80 can push down on the center of the lid 15, thereby ensuring good thermal contact between the heat transfer surface and the heat-producing component/device underneath.

The liquid-cooled cold plate can be easily manufactured because of the unique two-piece design. The lower heat transfer plater 10 may be made quickly and inexpensively through extrusion. Extrusion is an inexpensive manufacturing technique, unlike skiving micro fins, which is very machine-intensive, slow and prone to tolerance rejections. Other traditional techniques may be used to form the lower heat transfer plate 10, such as casting and milling. The lower heat transfer plate 10 would be formed of an inexpensive material that conducts heat efficiently—i.e., at least having a thermal conductivity of 150 W/(m*k)—which includes, for example, without limitations, cooper or aluminum. The lid 15 may be quickly and inexpensively manufactured using plastic injection molding and/or 3-D printing. The turbulators 25 may be made with a variety of materials, including but not limited to metal, rubber, and silicone. Assembly of these components is cost-efficient. A bill of materials for the liquid-cooled cold plate disclosed herein is approximately $8.70, broken down as turbulators (10 @ $0.20), lower heat transfer plate made of cooper ($2.40), lid ($1.30), adhesive ($1.00) and two fittings (2 @ $1.00).

Various example systems have been shown and described having various aspects and elements. Unless indicated otherwise, any feature, aspect or element of any of these systems may be removed from, added to, combined with or modified by any other feature, aspect or element of any of the systems. As will be apparent to persons skilled in the art, modifications and adaptations to the above-described systems and methods can be made without departing from the spirit and scope of the invention, which is defined only by the following claims. Moreover, the applicant expressly does not intend that the following claims "and the embodiments in the specification to be strictly coextensive." *Phillips v. AHW Corp.*, 415 F.3d 1303, 1323 (Fed. Cir. 2005) (en banc).

The invention claimed is:

1. A liquid-cooled cold plate for removing heat from an electronic component, the liquid-cooled cold plate comprising:
    a lower heat transfer plate comprising:
        a flat component contact surface constructed to make thermal contact with the electronic component;
        a plurality of parallel turbulator channels, the turbulator channels having walls that extend away from the component contact surface;
        wherein the heat transfer plate comprises a material with a thermal conductivity of greater than 150 W/(m*k);
    a lid forming a liquid tight seal with the lower heat transfer plate, the lid comprising:
        an inlet end comprising:
            an inlet port in fluid connection with an inlet channel manifold that allows for fluid communication between the plurality of parallel turbulator channels and the inlet port;
        an outlet end comprising:
            an outlet port in fluid connection with an outlet channel manifold that allows for fluid communication between the plurality of parallel turbulator channels and the outlet port; and
    a plurality of turbulators disposed of in the turbulator channels, wherein the plurality of turbulators is made of a compressible material, and the lid compresses the turbulators to form a seal within the plurality of turbulator channels.

2. The liquid-cooled cold plate of claim 1, wherein each in the plurality of turbulator channels has a non-circular cross-section taken perpendicularly to the turbulator channel walls.

3. The liquid-cooled cold plate of claim 1, wherein the liquid-cooled cold plate defines a coolant path entering through the inlet port, through the inlet channel manifold, through the plurality of parallel turbulator channels, and while in the turbulator channels contacting the turbulators, through the outlet channel manifold, and exiting through the outlet port.

4. The liquid-cooled cold plate of claim 1, further comprising a reinforcement member across a portion of the lid.

5. The liquid-cooled cold plate of claim 1, further comprising an outlet port fitting affixed to the outlet port, and constructed to make a liquid-tight seal with an outlet tube.

6. The liquid-cooled cold plate of claim 5, wherein the outlet port fitting is affixed through a threading between the outlet port fitting and the outlet port.

7. The liquid-cooled cold plate of claim 5, wherein the outlet port fitting comprises a gasket.

8. The liquid-cooled cold plate of claim 1, further comprising an inlet port fitting affixed to the inlet port, and constructed to make a liquid-tight seal with an inlet tube.

9. The liquid-cooled cold plate of claim 8, wherein the inlet port fitting is affixed through a threading between the inlet port fitting and the inlet port.

10. The liquid-cooled cold plate of claim 8, wherein the inlet port fitting comprises a gasket.

11. The liquid-cooled cold plate of claim 1, wherein the lid comprises one or more mounting holes.

12. The liquid-cooled cold plate of claim 1, comprising a gasket between the lower heat transfer plate and the lid, wherein the gasket assists in forming the liquid tight seal.

13. The liquid-cooled cold plate of claim 1, comprising adhesive between the lower heat transfer plate and the lid, wherein the adhesive assists in forming the liquid tight seal.

14. The liquid-cooled cold plate of claim 1, wherein the lid is brazed or soldered to the lower heat transfer plate, forming the liquid tight seal.

15. The liquid-cooled cold plate of claim 1, wherein the turbulators comprise a thermally conductive material, and are brazed or soldered to the lower heat transfer plate.

16. The liquid-cooled cold plate of claim 1, wherein formed in either or both of the lower heat transfer plate and the lid is a gasket channel, and a gasket or O-ring is disposed of in the gasket channel to assist in forming the liquid tight seal between the lower heat transfer plate to the lid.

17. A method of manufacturing a liquid-cooled cold plate for removing heat from an electronic component, the method comprising:
   forming a lower heat transfer plate comprised of a material with a thermal conductivity of greater than 150 W/(m*k), wherein the lower heat transfer plate comprises:
      a flat component contact surface constructed to make thermal contact with the electronic component; and
      a plurality of parallel turbulator channels, the turbulator channels having walls that extend away from the component contact surface;
   forming a lid comprising:
      an inlet end with an inlet port in fluid connection with an inlet channel manifold; and
      an outlet end with an outlet port in fluid communication with an outlet channel manifold;
   disposing a plurality of turbulators into the plurality of turbulator channels, wherein the turbulators are made of a compressible material; and
   mating the lower heat transfer plate to the lid to:
      form a liquid tight seal between the lower heat transfer plate to the lid; and
      compress the turbulators to form a seal within the plurality of turbulator channels.

18. The method of claim 17, wherein the formation of the lower heat transfer plate is by milling, casting or extrusion.

19. The method of claim 17, wherein the formation of the lid is by injection molding or 3-D printing.

20. The method of claim 17, wherein the mating further comprises the step of gluing or brazing the lid and the lower heat transfer plate together.

21. The method of claim 17, wherein formed into either or both of the lower heat transfer plate and lid is a gasket channel, and the method further includes inserting a gasket into the gasket channel to assist in forming the liquid tight seal between the lower heat transfer plate and the lid.

22. The method of claim 17, wherein the liquid-cooled cold plate defines a coolant path entering through the inlet port, through the inlet channel manifold, through the plurality of parallel turbulator channels, and while in the turbulator channels contacting the turbulators, through the outlet channel manifold, and exiting through the outlet port.

* * * * *